United States Patent
Dinkel

(10) Patent No.: US 11,588,325 B2
(45) Date of Patent: Feb. 21, 2023

(54) CIRCUIT AND METHOD FOR PROTECTING CIRCUIT ELEMENTS IN A TRAFFIC CONTROL SYSTEM FROM AN OVER CURRENT

(71) Applicant: Eberle Design, Inc., Phoenix, AZ (US)

(72) Inventor: Brian John Dinkel, Phoenix, AZ (US)

(73) Assignee: Eberle Design, Inc., Phoenix, AZ (US)

( * ) Notice: Subject to any disclaimer, the term of this patent is extended or adjusted under 35 U.S.C. 154(b) by 89 days.

(21) Appl. No.: 16/853,672

(22) Filed: Apr. 20, 2020

(65) Prior Publication Data

US 2021/0328423 A1    Oct. 21, 2021

(51) Int. Cl.
*H02H 9/02* (2006.01)
*H02H 1/00* (2006.01)
*H03M 1/12* (2006.01)

(52) U.S. Cl.
CPC ............ *H02H 9/02* (2013.01); *H02H 1/0007* (2013.01); *H03M 1/12* (2013.01)

(58) Field of Classification Search
CPC .. G01R 19/16571; H02H 1/0007; H02H 9/02; H02H 7/222; H02H 3/38; H02M 1/08; H02M 1/32; H02M 1/0009; H03K 17/0828; H03K 2217/0027; H03M 1/12
See application file for complete search history.

(56) References Cited

U.S. PATENT DOCUMENTS

| | | | |
|---|---|---|---|
| 2014/0078629 A1* | 3/2014 | Cortigiani | H03K 17/24 361/79 |
| 2019/0187190 A1* | 6/2019 | Akahane | H02H 7/222 |
| 2021/0006242 A1* | 1/2021 | Takagiwa | G01R 19/0092 |
| 2021/0006243 A1* | 1/2021 | Takagiwa | H02M 1/32 |

* cited by examiner

*Primary Examiner* — Jared Fureman
*Assistant Examiner* — Nicolas Bellido
(74) *Attorney, Agent, or Firm* — Jeffrey D. Moy; Weiss & Moy, PC

(57) ABSTRACT

A method and circuit for protecting circuit elements in a traffic control system from an overcurrent condition. In accordance with an embodiment, the circuit includes a current sensing element, a switching element, and a microcontroller. The circuit monitors first and second operating parameters and compares the first operating parameter with a first reference parameter and the second operating parameter with a second reference parameter. In response to the first operating parameter exceeding the first reference parameter and the second operating parameter exceeding the second reference parameter, the microcontroller generates a control signal to open the switching element.

16 Claims, 4 Drawing Sheets

CIRCUIT AND METHOD FOR PROTECTING CIRCUIT ELEMENTS IN A TRAFFIC CONTROL SYSTEM FROM AN OVER CURRENT

The present invention relates, in general, to circuits and, more particularly, limiting current to protect the circuits and loads coupled to the circuits.

Traffic control systems are designed to ensure the safety of vehicular and pedestrian traffic. In the past, these systems have included, for example, traffic signal control structures, malfunction management units, vehicle pre-emption and prioritization devices, data aggregators, vehicle detection systems, time sync signal generators, and power supplies operatively coupled together, and enclosed and protected by a control cabinet. These components can communicate with traffic signals, other traffic control systems, or with a central command center through hard-wired interconnects, through one or more cloud-based or locally deployed servers, or combinations thereof to control intersections, crosswalks, railroad crossings, or the like.

It is important that the sub-systems making up traffic control systems operate properly to ensure that vehicular traffic remains safe for all travelers. Because these sub-systems are comprised of circuits, the manufacturers of traffic control systems incorporate circuit protection features in their products. For example, a short circuit condition may cause the power supply within a traffic monitor system to generate dangerously high currents. The current levels may become so high that they damage loads coupled to the power supplies or damage components within the power supplies. In the past, traffic control systems have used root mean square ("RMS") analysis to determine an RMS voltage across a load, which is used to determine whether to activate short circuit protection in the traffic control system. A drawback with this approach is that the traffic system control circuit may become fatally damaged by a short circuit condition in the time required to make the determination to activate the short circuit protection. The time required to make the determination as to whether the traffic control system is experiencing a short circuit condition typically takes two alternating current ("AC") line cycles, which may be undesirable.

Accordingly, it would be advantageous to have safety features to further protect traffic control systems from conditions that would damage, for example, circuit components making up the traffic control systems. It would be of further advantage for the improved traffic control system and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
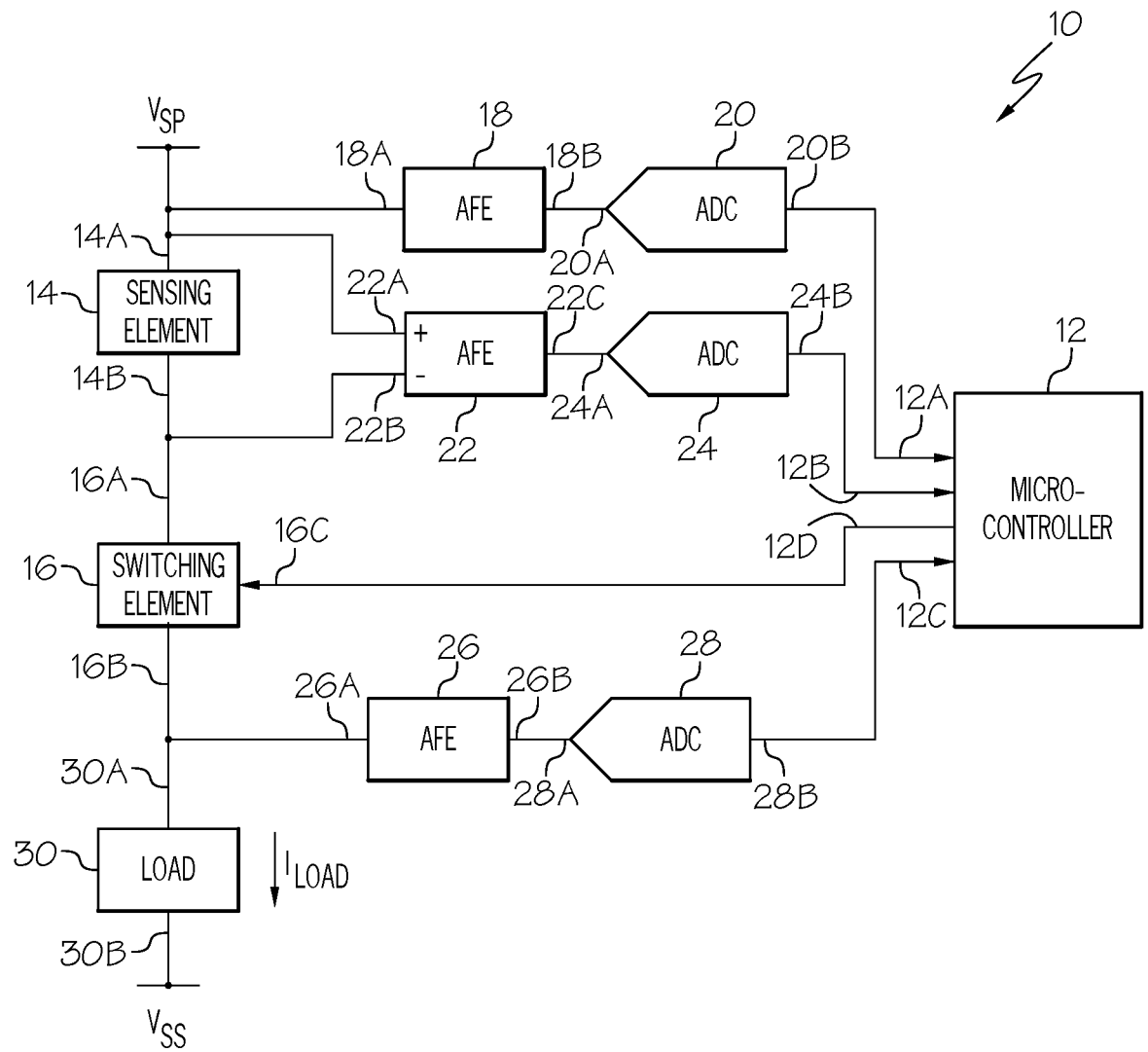
FIG. 1 is a circuit diagram of an overcurrent protection circuit in accordance with an embodiment of the present invention.

It will be appreciated by those skilled in the art that the words during, while, and when as used herein are not exact terms that mean an action takes place instantly upon an initiating action but that there may be some small but reasonable delay, such as a propagation or processing delay, between the reaction that is initiated by the initial action and the initial action. The use of the word approximately, about, or substantially means that a value of an element has a parameter that is expected to be very close to a stated value or position. However, as is well known in the art there are always minor variances that prevent the values or positions from being exactly as stated.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein. Unless expressly stated otherwise, "connected," if used herein, means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

The terms "comprise," "include," "have" and any variations thereof are used synonymously to denote non-exclusive inclusion. The terms "left," "right," "in," "out," "front," "back," "up," "down," and other such directional terms are used to describe relative positions, not necessarily absolute positions in space. The term "exemplary" is used in the sense of "example" rather than "ideal."

DETAILED DESCRIPTION

The following detailed description is merely exemplary in nature and is not intended to limit the range of possible embodiments, implementations, and applications. Furthermore, there is no intention to be bound by any theory presented in the preceding background or the following detailed description.

For simplicity and clarity of illustration, the drawing figures depict the general topology, structure and/or manner of construction of the various embodiments. Descriptions and details of well-known features and techniques may be omitted to avoid unnecessarily obscuring other features. For example, conventional techniques and components related to traffic control devices are not described in detail herein. Elements in the drawing figures are not necessarily drawn to scale, i.e., the dimensions of some features may be exaggerated relative to other elements to assist understanding of the example embodiments.

FIG. 1 is a circuit diagram of an overcurrent protection circuit 10 in accordance with an embodiment of the present invention. Overcurrent protection circuit 10 includes a microcontroller 12 coupled to a sensing element 14 and to a switching element 16. Overcurrent protection circuit 10 further includes an analog front end ("AFE") 18 having a single ended input terminal 18A connected to a terminal 14A of sensing element 14 and an output terminal 18B connected to an input terminal 20A of an analog-to-digital converter ("ADC") 20. ADC 20 has an output terminal 20B connected to an input terminal 12A of microcontroller 12. It should be noted that single ended input 18A of AFE 18 is a high impedance input.

An analog front end ("AFE") 22 has a noninverting differential input terminal 22A connected to terminal 14A of sensing element 14 and an inverting differential input terminal 22B connected to a terminal 14B of sensing element 14 and to a terminal 16A of switching element 16. This configuration allows measuring the voltage across sensing element 14. AFE 22 has an output terminal 22C connected to an input terminal 24A of an analog-to-digital converter ("ADC") 24. Thus, terminals 14A, 18A, and 22A are commonly connected together and coupled for receiving signal power ("$V_{SP}$"). ADC 24 has an output terminal 24B connected to an input terminal 12B of microcontroller 12. Thus, terminals 14B, 16A, and 22B are commonly connected together. It should be noted that for direct current ("DC") systems, signal power $V_{SP}$ typically ranges from about zero (0) volts to about forth-eight (48) volts and the circuit components are capable of tolerating voltages of sixty (60) volts or more. For alternating current ("AC") systems, signal voltage $V_{SP}$ can typically support one hundred and twenty (120) volts AC or two hundred and forty (240) volts AC, with the components selected to have tolerances for the selected voltage for signal power $V_{SP}$. Components are selected to support safe operating ranges in response to voltage excursions due to noise or other factors that may influence power delivery to overcurrent protection circuit 10.

An analog front end ("AFE") 26 has a single ended input terminal 26A connected to a terminal 16B of switching element 16 and an output terminal 26B connected to an input terminal 28A of an analog-to-digital converter ("ADC") 28. Single ended input 26A of AFE 26 is a high impedance input. ADC 28 has an output terminal 28B connected to an input terminal 12C of microcontroller 12. Thus, terminals 16B and 26A are commonly connected together. Although AFE's 18 and 26 have been described as having single-ended inputs, this is not a limitation. For example, they may be configured to have differential inputs. It should be noted that terminals 16A and 16B may be referred to as current carrying or current conducting terminals. AFE's 18, 22, and 26 may be referred to as analog front end circuits or analog front end structures.

Microcontroller 12 further includes an output terminal 12D connected to a control terminal 16C of switching element 16.

Commonly connected terminals 26A and 16B of overcurrent protection circuit 10 are coupled to a load 30 via a load terminal 30A. A load terminal 30B of load 30 is coupled for receiving a source of operating potential $V_{SS}$. By way of example operating potential $V_{SS}$ is a ground potential. Load 30 can be a capacitive load or a resistive load.

Figure 2:
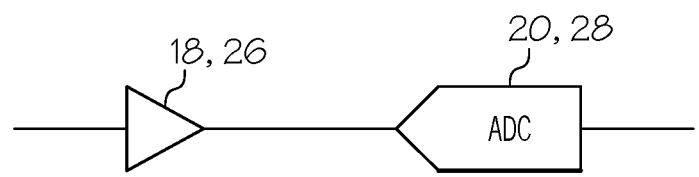
FIG. 2 is a circuit diagram of an analog front end and an analog-to-digital converter in accordance with an embodiment of the present invention.

FIG. 2 is a circuit diagram of an analog front end and an analog-to-digital converter in accordance with an embodiment of the present invention. The analog front end comprises an amplifier in a single ended configuration. It should be noted that reference characters 18 and 26 have been used to identify the analog front ends and reference characters 20 and 28 have been used to identify the analog-to-digital converters because they can be used for the combination of AFE 18 and ADC 20 or the combination of AFE 26 and ADC 28. Thus, the element identified by reference character 18, 26 represents AFE 18 or AFE 26, and the element identified by reference character 20, 28 represents ADC 20 or ADC 28.

Figure 3:
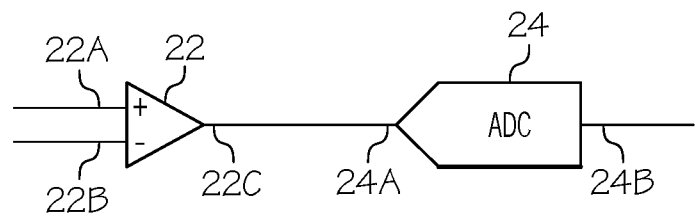
FIG. 3 is a circuit diagram of an analog front end and an analog-to-digital converter in accordance with another embodiment of the present invention.

FIG. 3 is a circuit diagram of an analog front end and an analog-to-digital converter in accordance with another embodiment of the present invention. Analog front end 22 comprises an amplifier in a differential configuration. The differential inputs of amplifier 22 are high impedance inputs and thus ideally current does not flow through inputs 22A and 22B.

Figure 4:
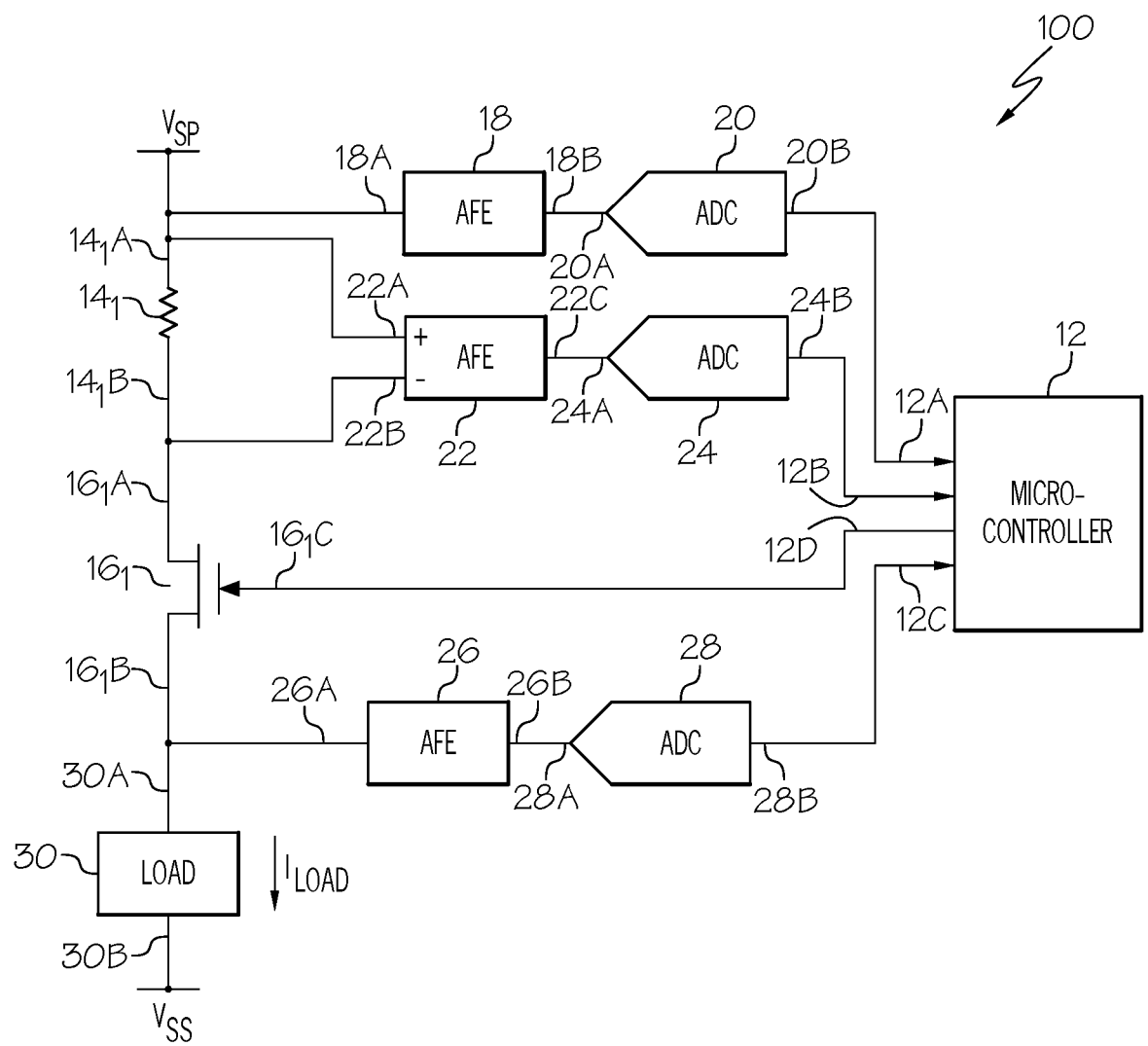
FIG. 4 is a circuit diagram of an overcurrent protection circuit in accordance with another embodiment of the present invention.

FIG. 4 is a circuit diagram of an overcurrent protection circuit 100 in accordance with an embodiment of the present invention. In accordance with the embodiment of FIG. 4, sensing element 14 and switching element 16 of FIG. 1 are a resistor $14_1$ and a field effect transistor $16_1$, respectively. Accordingly, resistor $14_1$ has terminals $14_1A$ and $14_1B$ that correspond to terminals 14A and 14B of sensing element 14, respectively, and field effect transistor $16_1$ has terminals $16_1A$, $16_1B$, and $16_1C$ that correspond to terminals 16A, 16B, and 16C of switching element 16, respectively. Thus, terminals 18A and 22A are commonly connected to terminal $14_1A$ of resistor $14_1$, terminals $14_1B$ and 22B are commonly connected to terminal $16_1A$ of transistor $16_1$, terminals $16_1B$ and 26A are commonly connected to terminal 30A of load 30, and output terminal 12D is connected to control terminal $16_1C$ of transistor $16_1$. It should be appreciated that terminal $16_1C$ may be a gate electrode or gate terminal of transistor $16_1$ and terminals $16_1A$ and $16_1B$ of transistor $16_1$ are current conducting terminals or current carrying terminals such as for example drain and source terminals.

Figure 5:
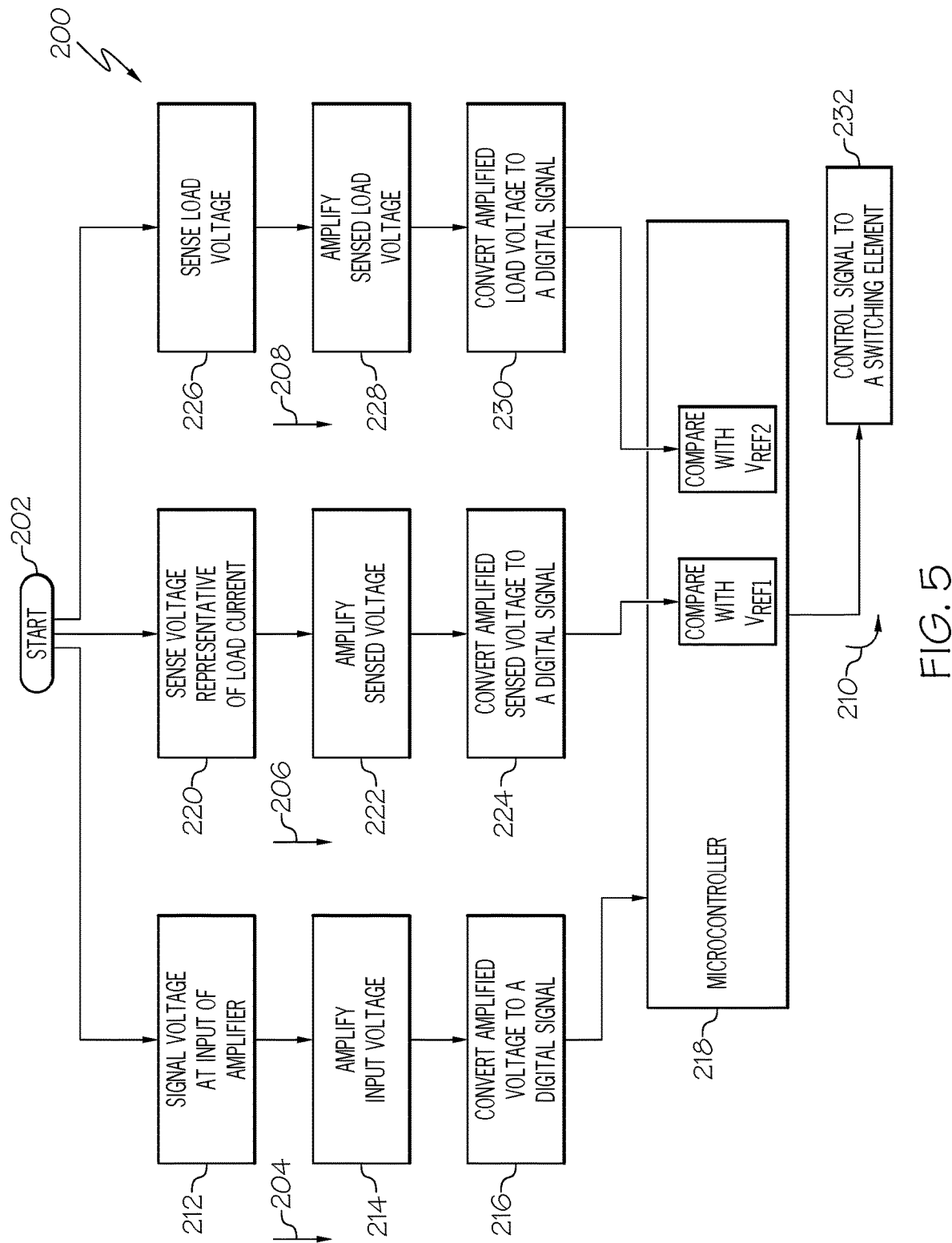
FIG. 5 is a flow diagram for protecting a circuit in accordance with an embodiment of the present invention.

FIG. 5 is a flow diagram 200 of a method for protecting a circuit against an overcurrent condition in one or more circuits in a traffic safety system. An overcurrent detection circuit starts to monitor (identified by box 202), for example, a voltage at a power signal node along a signal path identified by arrow 204, a current through a sensing element and a switching element along a signal path identified by arrow 206, and a voltage across a load along a signal path identified by signal path 208. In response to the signals along signal paths 204, 206, and 208, a control circuit such as, for example, a microcontroller generates a control signal that is transmitted along signal path 210 to open and close a switching element configured to control a current through a load.

In operation, an overcurrent protection circuit such as, for example, the overcurrent protection circuits of FIG. 1 or 4 monitors currents and voltages associated with loads coupled to the overcurrent protection circuits. It should be noted that the current associated with a load and the voltage across the load may be referred to as operating parameters. Analog front end amplifier 18 receives a power signal voltage at its input 18A (identified by box 212) and amplifies the voltage (identified by box 214). Analog-to-digital converter 20 converts the amplified voltage into a digital signal (identified by box 216). The digital signal may be referred to as a digitized voltage signal. The digitized voltage signal is input into a microcontroller (identified by box 218). The microcontroller uses the digitized voltage signal to determine an indication or status of the signal level that powers the circuits of the traffic safety system. It should be understood the microcontroller can be, for example, microcontroller 12.

A differential analog front end amplifier 22 senses the voltage across a sensing element 14 (identified box 220), amplifies the sensed voltage (identified by box 222) and transmits the amplified sensed voltage into analog-to-digital converter 24, which converts the amplified sensed voltage into a digitized signal or a digitized voltage signal (identified by box 224). The digitized voltage signal is representative of or indicative of the current flowing through the series combination of sensing element 14 and a switching element 16 because the current can be determined using Ohm's Law, the digitized voltage and the resistance of sensing element 14. Microcontroller 12 compares the digitized voltage signal with a reference voltage $V_{REF1}$ to generate a current flow comparison value and uses the current flow comparison value to determine if the current flowing through sensing element 14, switching element 16, and into load 30 is within normal operating levels or if it exceeds a safe maximum operating level. If the current exceeds the safe maximum operating level, there may be a short or other failure in the circuit which could damage the traffic control system.

Analog front end amplifier 26 receives or senses a load voltage at its input 26A (identified by box 226) and amplifies the voltage (identified by box 228). Analog-to-digital converter 28 converts the amplified voltage into a digital signal (identified by box 230). The digital signal may be referred to as a digitized voltage signal. The digitized voltage signal is input into microcontroller 12 (identified by box 218). Microcontroller 12 compares the digitized voltage with a reference voltage $V_{REF2}$ to generate a load voltage comparison value and uses the load voltage comparison value to determine if the load voltage is within normal operating levels or if it exceeds a safe maximum operating level. If the voltage exceeds the safe maximum operating level, there may be a short or other failure in the circuit which could damage the traffic control system. It should be noted that reference voltages $V_{REF1}$ and $V_{REF2}$ may be at the same voltage value or at different voltage values.

In accordance with this embodiment, the digitized voltage signal representative of the current flowing through sensing element 14, switching element 16, and into load 30 serves as an operating parameter. Alternatively, the voltage across sensing element 14 may serve as the operating parameter because it is a representation of the current flowing through sensing element 14, switching element 16, and into load 30. The voltage across load 30 may serve as an operating parameter. For example, the digitized voltage signal representative of the current flowing through sensing element 14, switching element 16, and into load 30 may be a first operating parameter, the voltage across load 30 may be a second operating parameter, reference voltage $V_{REF1}$ may be a first reference parameter, and reference voltage $V_{REF2}$ may be a second reference parameter. Thus, the first and second operating parameters are determined and compared with first ($V_{REF1}$) and second ($V_{REF2}$) reference parameters, respectively.

In a normal operating mode, switching element 16 is closed or in a closed configuration in response to a control signal generated by microcontroller 12 of overcurrent protection circuit 10. It should be noted that in embodiments in which switching element 16 is a transistor, it is in a closed configuration when the transistor is on or enabled. In response to switching element 16 being in a closed configuration, a current LOAD flows through sensing element 14, switching element 16, and to load 30 to generate a voltage across sensing element 14 and a voltage across load 30. The voltage across sensing element 14 is a signal that is indicative of the level of current $I_{LOAD}$.

Microcontroller 12 compares the signal indicative of the level of current $I_{LOAD}$ with reference voltage level $V_{REF1}$ and compares the voltage across load 30 with reference level $V_{REF2}$ to determine the operating state of overcurrent protection circuit 10. Microcontroller 12 maintains switching element 16 in the closed configuration in response to the signal indicative of the level of current $I_{LOAD}$ being less than reference voltage level $V_{REF1}$ and the voltage across load 30 being less than $V_{REF2}$. Microcontroller 12 opens switching element 16, i.e., places switching element 16 in an open configuration, in response to the signal indicative of the level of current $I_{LOAD}$ exceeding reference voltage level $V_{REF1}$ or the voltage across load 30 being less than $V_{REF2}$ because this is an indication of a short circuit present within the traffic signal control circuit.

During a start-up operating mode for embodiments in which load 30 is a capacitive load, the capacitive load may appear as a short circuit to current flow in response to the initial current flow. Thus, the initial load current $I_{LOAD}$ may be a surge current that is very high while charging capacitive load 30. In this situation, the voltage across the capacitive load 30 is small, but rising as load current $I_{LOAD}$ charges capacitive load 30. Accordingly, in the start-up operating mode, the signal indicative of the level of current LOAD may exceed reference voltage level $V_{REF1}$ and the voltage across load 30 may be less than reference voltage level $V_{REF2}$. Microcontroller 12 recognizes the start-up operating mode and initially generates a control signal (indicated by box 232) that maintains switching element 16 in a closed configuration. In response to switching element 16 being closed, current $I_{LOAD}$ flows through sensing element 14, switching element 16, and load 30 to generate a voltage across sensing element 14 and a voltage across load 30.

It should be noted that for embodiments in which the load is a capacitive load, it may be partially charged in response to the initial current flowing through the load. After a predetermined period of time, the operating parameter representing the digitized voltage signal representative of the current flow through sensing element 14, switching element 16, and into load 30 is updated, i.e., an updated operating parameter, is determined for the digitized voltage signal representative of the current LOAD flowing into the load 30. In addition, an operating parameter representing the voltage across load 30 is updated, i.e. an updated operating parameter is determined for the voltage across load 30.

Microcontroller 12 compares the updated signal indicative of the current level with reference voltage level $V_{REF1}$ to generate a first comparison value and compares the updated voltage across load 30 with reference level $V_{REF2}$ to generate a second comparison value. Microcontroller 12 generates a control signal to maintain switching element 16 in a closed configuration in response to the updated signal indicative of the current level being less than reference voltage level $V_{REF1}$ and the updated voltage across load 30 being less than $V_{REF2}$. Microcontroller 12 generates a control signal to disable or open switching element 16 in response to the updated signal indicative of the current level, e.g., a first operating parameter, exceeding reference voltage level $V_{REF1}$, e.g., a first reference parameter and the updated voltage across load 30, e.g., a second operating parameter, being greater than voltage level $V_{REF2}$, e.g., a second reference parameter. Thus, microcontroller 12 switchable controls the current flowing through sensing element 14, switching element 16, and load 30 in response to the first comparison value and the second comparison value.

In a start-up operating mode, the load current $I_{LOAD}$ decreases to a nominal operating level and the load voltage stabilizes at a nominal safe operating level. Microcontroller 12 continues to: generate updated signals indicative of the load current level; generate updated voltages across load 30; compare the updated signals indicative of the load current level with reference voltage $V_{REF1}$ to determine if the current flowing though sensing element 14 stabilizes or is stabilizing at a nominal current level; and compare the updated voltages across load 30 with the reference voltage $V_{REF2}$ to determine if the load voltage across load 30 has stabilized or is stabilizing at a nominal voltage level. In response to the load current and the load voltage stabilizing to their nominal levels, microcontroller 12 recognizes that the high load current level resulted from the circuit being in a start-up mode and generates a control signal that keeps switching element 16 closed and conducting current (indicated by box 232). The process of updating the operating parameter that is determined for the digitized voltage signal representative of the current flow into load 30 and updating the operating parameter that is determined for the voltage across load 30 may be repeated a predetermined number of times or continuously depending on the particular application.

Alternatively, in response to load current $I_{LOAD}$ remaining at a high level and the load voltage continuing to increase or being greater than a safe nominal level, microprocessor 12 generates a control signal to open switching element 16 (indicated by box 232) and stop the current flowing through load 30 to protect current sensing element 14, switching element 16, and load 30. Thus, microcontroller 12 generates a control signal to disable switching element 16 in response to the updated first operating parameter exceeding reference parameter $V_{REF1}$ and the updated second operating parameter exceeding reference parameter $V_{REF2}$.

It should be noted that microcontroller 12 may be configured to generate a control signal to enable or turn on switching element 16 in response to the first operating parameter exceeding reference parameter $V_{REF1}$ and the second operating parameter being less than reference parameter $V_{REF2}$. In this situation, load current $I_{LOAD}$ is high but the load voltage is within a safe operating level. Alternatively, microcontroller 12 may be configured to generate a control signal to disable or turn off switching element 16 in response to the first operating parameter exceeding reference parameter $V_{REF1}$ and the second operating parameter being less than reference parameter $V_{REF2}$. In this situation, load current $I_{LOAD}$ is high and the load voltage is within a safe operating level, however, it may be desirable to stop the current from flowing to the load 30.

By now it should be appreciated that an overcurrent detection method and circuit for use in a traffic management systems have been provided. In accordance with embodiments of the present invention, a short circuit condition is quickly recognized, allowing the overcurrent protection circuit to rapidly open or turn off a switching element to stop current flow and prevent damage to the circuit elements such as, for example, the sensing elements and switching elements, within a traffic control system. An advantage of embodiments in accordance with the present invention is that they provide short circuit protection quicker than previous methods or structures. For example, previous methods and structures require at least two Alternating Current ("AC") line cycles, which is about 33 milliseconds in the United States. Applicant has provided a circuit and method for switchably controlling the current flowing through the circuit element in less than two alternating current line cycles. Accordingly, damage to circuit components is mitigated by maintaining operation of the components within their designed tolerances, which also mitigates failure of field connections by limiting thermal exposure to wires, wire harnesses and the environment in which they reside.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for protecting circuit elements in a traffic control system from an overcurrent condition, comprising:
   closing a switching element;
   determining a first operating parameter and a second operating parameter;
   comparing the first operating parameter with a first reference parameter and the second operating parameter with a second reference parameter; and
   maintaining the switching element in a closed configuration or disabling the switching element in response to the first operating parameter exceeding the first reference parameter and the second operating parameter being less than the second reference parameter.

2. The method of claim 1, further including:
   determining an updated first operating parameter and an updated second operating parameter after a first predetermined period of time;
   comparing the updated first operating parameter with the first reference parameter and the updated second operating parameter with the second reference parameter; and
   opening the switching element in response to the updated first operating parameter exceeding the first reference parameter and the updated second operating parameter exceeding the second reference parameter.

3. The method of claim 1, wherein maintaining the switching element in a closed configuration or disabling the switching element comprises maintaining the switching element in the closed configuration in response to an updated second operating parameter being less than the second reference parameter.

4. The method of claim 1, further including:
   determining an updated first operating parameter and an updated second operating parameter after a first predetermined period of time;
   comparing the updated first operating parameter with the first reference parameter and the updated second operating parameter with the second reference parameter; and
   opening the switching element in response to the updated first operating parameter exceeding the first reference parameter and the updated second operating parameter being less than the second reference parameter.

5. The method of claim 1, wherein the first operating parameter is a first voltage that is representative of a first current and the second operating parameter is a second voltage.

6. The method of claim 1, wherein determining the first operating parameter comprises monitoring a first current flowing through a load and determining the second operating parameter comprises monitoring a first voltage across the load.

7. The method of claim 1, wherein disabling the switching element comprises turning off a transistor.

8. The method of claim 1, wherein disabling the switching element comprises opening a switch.

9. The method of claim 1, further including using a microcontroller to compare the first operating parameter with the first reference parameter and the second operating parameter with the second reference parameter and using the microcontroller to disable the switching element.

10. A method for protecting a component of a traffic control system from an overcurrent condition, comprising:
  comparing a current level of a current flowing through a circuit element with a first reference level to generate a first comparison value;
  comparing a voltage level across a load electrically coupled to the circuit element to with a second reference level to generate a second comparison value; and
  switchable controlling the current flowing through the circuit element in response to the first comparison value and the second comparison value;
  wherein comparing the current level of the current flowing through the circuit element with the first reference level to generate the first comparison value comprises:
  determining a voltage across a resistor through which the current is flowing;
  converting the voltage across the resistor into a digital voltage representation of the current level of the current flowing through the circuit element;
  using a microcontroller to compare the digital voltage representation of the current level with the first reference level to generate the first comparison value.

11. The method of claim 10, further including generating a switching control signal in response to the first comparison value and the second comparison value.

12. The method of claim 10, wherein switchable controlling the current flowing through the circuit element includes disabling a switch in response to a switching control signal, wherein the switching control signal is generated by the microcontroller.

13. The method of claim 10, wherein switchable controlling the current flowing through the circuit element includes turning off a transistor that functions as a switch.

14. The method of claim 10, wherein the load is a capacitive load or a resistive load.

15. The method of claim 10, further including comparing the current level of the current flowing through the circuit element with the first reference level to generate the first comparison value and comparing the voltage level of the voltage across the load electrically coupled to the circuit element to generate the second comparison value in response to a start-up mode.

16. The method of claim 10, further including switchable controlling the current flowing through the circuit element in less than two alternating current line cycles.

* * * * *